(12) United States Patent
Tsukamoto et al.

(10) Patent No.: US 8,304,294 B2
(45) Date of Patent: Nov. 6, 2012

(54) LEAD FRAME SUBSTRATE AND METHOD OF MANUFACTURING THE SAME

(75) Inventors: Takehito Tsukamoto, Tokorozawa (JP); Susumu Maniwa, Kasukabe (JP); Junko Toda, Kasukabe (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 13/064,314

(22) Filed: Mar. 17, 2011

(65) Prior Publication Data

US 2011/0169153 A1  Jul. 14, 2011

Related U.S. Application Data

(63) Continuation of application No. PCT/JP2009/005033, filed on Sep. 30, 2009.

(30) Foreign Application Priority Data

Sep. 30, 2008  (JP) ................................ P2008-254311

(51) Int. Cl.
*H01L 21/00*  (2006.01)
(52) U.S. Cl. ........ 438/123; 438/107; 438/113; 438/124; 257/E23.032; 257/672; 257/676
(58) Field of Classification Search ........... 257/E23.031, 257/E23.032, E23.037, E23.124, 672, 676, 257/692, 693, 697; 438/107, 113, 123, 124, 438/215, 214, 411, 461, 611, 617; 216/14
See application file for complete search history.

(56) References Cited

U.S. PATENT DOCUMENTS

| | | | | |
|---|---|---|---|---|
| 6,025,640 A * | 2/2000 | Yagi et al. | ...................... | 257/666 |
| 6,646,339 B1 * | 11/2003 | Ku et al. | ...................... | 257/708 |
| 6,713,322 B2 * | 3/2004 | Lee | ............................... | 438/123 |
| 6,838,752 B2 * | 1/2005 | Diot | .............................. | 257/666 |

(Continued)

FOREIGN PATENT DOCUMENTS

JP   9-307043   11/1997

(Continued)

OTHER PUBLICATIONS

International Search Report for PCT/JP2009/005033, mailed Nov. 17, 2009.

*Primary Examiner* — Chris Chu

(57) ABSTRACT

A method includes: forming a photoresist pattern to form each of a semiconductor element mounting section on which a semiconductor element is mounted, semiconductor element electrode connection terminals for connection with electrodes of the semiconductor element, and a first outer frame section on a first surface of a metal plate; forming a photoresist pattern to form each of external connection terminals, a second outer frame section, and grooves in at least a part of the second outer frame section on a second surface of the metal plate; etching a metal plate exposing section, in which the metal plate of the second surface is exposed, to form holes that do not pass through the metal plate exposing section and grooves that run from an inside to an outside of the second outer frame section; coating a pre-mold resin on the holes and the grooves, and heating the pre-mold resin under pressure using a flat-bed press to form a resin layer; and etching the first surface to form the semiconductor element mounting section, the semiconductor element electrode connection terminals electrically connected with the external connection terminals, and the first outer frame section.

4 Claims, 5 Drawing Sheets

U.S. PATENT DOCUMENTS

| | | | |
|---|---|---|---|
| 6,858,919 B2 * | 2/2005 | Seo et al. | 257/666 |
| 6,927,483 B1 * | 8/2005 | Lee et al. | 257/676 |
| 7,087,986 B1 * | 8/2006 | Bayan et al. | 257/676 |
| 7,102,209 B1 * | 9/2006 | Bayan et al. | 257/666 |
| 7,132,733 B2 * | 11/2006 | Itou et al. | 257/666 |
| 7,154,186 B2 * | 12/2006 | Noquil et al. | 257/778 |
| 2003/0006055 A1 * | 1/2003 | Chien-Hung et al. | 174/52.1 |
| 2005/0029636 A1 * | 2/2005 | Paek | 257/666 |

FOREIGN PATENT DOCUMENTS

| | | |
|---|---|---|
| JP | 2003-309241 | 10/2003 |
| JP | 2003-309242 | 10/2003 |
| JP | 2004-63742 | 2/2004 |
| JP | 3642911 | 2/2005 |
| JP | 2007-281207 | 10/2007 |

* cited by examiner

LEAD FRAME SUBSTRATE AND METHOD OF MANUFACTURING THE SAME

CROSS REFERENCE TO RELATED APPLICATIONS

This application is a continuation application, under 35 U.S.C. §111(a), of International Application No. PCT/JP2009/005033, filed Sep. 30, 2009, which claimed priority to Japanese Application No. 2008-254311, filed Sep. 30, 2008, the disclosures of which are hereby incorporated by reference.

TECHNICAL FIELD

The present invention relates to a semiconductor package substrate which mounts a semiconductor element, and more particularly, to a lead frame substrate and a method of manufacturing the same.

BACKGROUND ART

In semiconductor packages using a lead frame represented by a quad flat package (QFP), outer leads for connection with a printed circuit board are disposed on side surfaces of the semiconductor package.

Such a lead frame is allowed to obtain a semiconductor element mounting section, inner leads acting as sections for connection with semiconductor element electrodes, outer leads, and an outer frame section fixing them by forming desired photoresist patterns on both surfaces of a metal plate and etching the both surfaces of the metal plate. Further, these sections can be obtained by punching using a press in addition to the etching method.

In an assembly process of the semiconductor package, the semiconductor element is die-bonded onto the semiconductor element mounting section, and then the electrodes of the semiconductor element are electrically connected with the inner leads using, for instance, gold wires. Afterwards, the surroundings of the semiconductor element including the inner leads are encapsulated with a resin, and the outer frame section is cut off. If necessary, the outer leads are bent.

In this way, the outer leads disposed on the side surfaces are limited to a range from 200 to 300 pins in a package size of about 30 mm² from the viewpoint of a processing ability of miniaturization.

In recent years, as the number of electrodes of the semiconductor element increases, a lead frame type semiconductor package having outer leads on side surfaces thereof does not have a terminal number corresponding to the electrode number. Some external connection terminals of, for example, a ball grid array (BGA) type or a land grid array (LGA) type for connection with a printed circuit board are replaced by a semiconductor package disposed in an array form on a bottom surface of a package substrate. The substrates used for these packages are generally configured to drill holes through a glass epoxy substrate having copper bonded on both surfaces thereof, bring a wall of each hole into conduction by means of plating, and form terminals for connection with the electrodes of the semiconductor element on one of the surfaces and external connection terminals arranged in an array form on the other surface.

However, the manufacturing of the substrates requires a complicated process as well as a high cost, and provides low reliability compared to the lead frame type package because the plating is used to connect interconnections within the substrate.

For this reason, a BGA type semiconductor package structure using a lead frame, in which a process of etching the lead frame from both surfaces is used, is disclosed (Patent Document 1).

In this structure, connection terminals for semiconductor element electrode are formed on one surface and external connection terminals are formed in an array form on the other surface by changing two photoresist patterns and etching the patterns at the same time or by etching one of the photoresist patterns, forming an electrodeposited polyimide layer or coating a pre-mold resin on the etched surface, and then etching the other photoresist pattern.

Patent Document 1: Japanese Patent No. 3642911

DISCLOSURE OF INVENTION

Problem to be Solved by the Invention

FIGS. 5A and 5B are cross-sectional views showing the related art.

In a BGA type lead frame, when the number of external connection terminals 111 increases, an interconnection 110 on the side of each semiconductor element electrode connection terminal 109 is lengthened. Since this interconnection is formed by half-etching a metal plate, it has a narrow width as well as a thin thickness. Thus, the interconnection is broken or bent in processes following the etching, so that the yield is greatly reduced.

It is disclosed in Patent Document 1 that, first, half-etching is performed only on the side of the external connection terminals 111, an electrodeposited polyimide layer 117 is formed on the etched surface, and the side of the semiconductor element electrode connection terminals 109 is formed by etching. Thereby, although the fine interconnections 110 are thin films, the fine interconnections 110 are supported by the polyimide layer 117, so that the interconnections are prevented from being broken or bent when the lead frame is manufactured.

However, when the semiconductor element is mounted on the lead frame substrate having this structure, and then the semiconductor element electrodes are connected with the connection terminals 109 by wire bonding, a wire connecting force is not applied because each connection terminal 109 has a hollow lower portion, and connection failures take place. Thus, an assembly yield is remarkably reduced.

Meanwhile, although not disclosed in Patent Document 1, a countermeasure of thickening a resin layer by potting a pre-mold resin instead of the electrodeposited polyimide layer is also taken into consideration. According to this countermeasure, it is expected to be able to avoid the problem with bonding failures to some extent.

However, it can never be said that this countermeasure is a satisfactory technique. The reason for this is that the hollow state cannot be entirely avoided. Further, it is very difficult to adjust a coated amount of the pre-mold resin. When the coated amount becomes excessive, there is a possibility of causing a problem that the resin layer is formed even on the external connection terminals 111 and thus a removal process is required. In addition, since the pre-mold resin is generally a thermosetting epoxy resin, the shrinkage is inevitable in the curing process, and there is another possibility of causing problems that it is impossible to ensure adhesion to the metal surface after etching, and that peeling is caused by heating in the assembly process, or that it is impossible to ensure reliability of a temperature cycle test.

The present invention has been made in view of the above-described circumstances, and an object of the invention is to provide a lead frame substrate and a method of manufacturing the same, capable of coping well with an increase in the number of electrodes of a semiconductor element, providing high reliability, and performing manufacturing and assembling of a semiconductor package in an easy and stable manner.

Means for Solving the Problem

A first aspect of the present invention is a method of manufacturing a lead frame substrate, the method including: forming a photoresist pattern to form each of a semiconductor element mounting section on which a semiconductor element is mounted, semiconductor element electrode connection terminals for connection with electrodes of the semiconductor element, and a first outer frame section on a first surface of a metal plate; forming a photoresist pattern to form each of external connection terminals, a second outer frame section, and grooves in at least a part of the second outer frame section on a second surface of the metal plate; etching a metal plate exposing section, in which the metal plate of the second surface is exposed, to form holes that do not pass through the metal plate exposing section and grooves that run from an inside to an outside of the second outer frame section; coating a pre-mold resin on the holes and the grooves, and heating the pre-mold resin under pressure using a flat-bed press to form a resin layer; and etching the first surface to form the semiconductor element mounting section, the semiconductor element electrode connection terminals electrically connected with the external connection terminals, and the first outer frame section.

A second aspect of the present invention is a method, wherein, after the holes and the grooves are formed in the metal plate exposing section of the second surface, the etched second surface is roughened.

A third aspect of the present invention is a lead frame substrate including: a metal plate having first and second surfaces; a semiconductor element mounting section formed on the first surface and configured to mount a semiconductor element; semiconductor element electrode connection terminals, formed on the first surface, for connection with electrodes of the semiconductor element; a first outer frame section formed on the first surface; external connection terminals formed on the second surface and electrically connected with the semiconductor element electrode connection terminals; a resin layer formed on the second surface; a second outer frame section formed on the second surface and integrally formed with the first outer frame section; grooves formed in at least a part of a side of the second surface and running from an inside to an outside of the second outer frame section; and holes formed on the side of the second surface, filled with the resin layer, and configured not to pass through the metal plate.

A fourth aspect of the present invention is a lead frame substrate, wherein the holes have roughened surfaces.

Effect of the Invention

According to the present invention, external connection terminals for connection with a printed circuit board can be disposed in an array form on the entire rear surface of a lead frame substrate, and cope with an increase in the number of pins of a semiconductor element. Further, it is possible to ensure reliability against thermal stress because of a substrate based on a lead frame and use of no plating interconnections.

Meanwhile, when the lead frame substrate is manufactured, interconnection failures such as broken or bent interconnections do not occur. When a wire bonding process, i.e., a semiconductor package assembly process, is performed, a lower portion of each wire-bonding connection terminal can be stabilized and connected because a pre-mold resin layer is present on the same plane as the surface of the external connection terminal.

BEST MODE FOR CARRYING OUT THE INVENTION

FIGS. 1A through 1G are cross-sectional views schematically showing a process of manufacturing a lead frame substrate according to an embodiment of the present invention.

Figure 1A:
FIG. 1A is a cross-sectional view showing an example of a method of manufacturing a lead frame substrate according to an embodiment of the present invention.
Figure 1B:
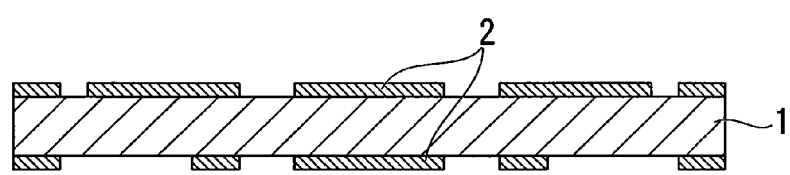
FIG. 1B is a cross-sectional view showing an example of a method of manufacturing a lead frame substrate according to the embodiment of the present invention in the process following that of FIG. 1A.

Photoresist patterns 2 are formed on both surfaces of a metal plate 1 (FIG. 1A) used for a lead frame (FIG. 1B). In FIGS. 1A through 1G, a pattern for a semiconductor element mounting section 8, connection terminals 9 for semiconductor element electrodes, interconnections 10, and an outer frame section 12 is formed on an upper surface of the metal plate 1, and a pattern for external connection terminals 11 and an outer frame section is formed on a lower surface of the metal plate 1. Simultaneously, to form grooves in at least a part of the outer frame section of the lower surface from the inside outward, a pattern, which is fine enough to leave no photoresist pattern when etched, is formed on a groove formation region (not shown).

As the metal plate 1, any material may be used if it has etchability, mechanical strength, thermal conductivity, coefficient of expansion, and the like suitable for the lead frame. However, an iron-nickel alloy represented by Alloy42, a copper alloy in which a variety of metal elements are added to improve mechanical strength, or the like is often used as the metal plate 1.

Figure 1C:
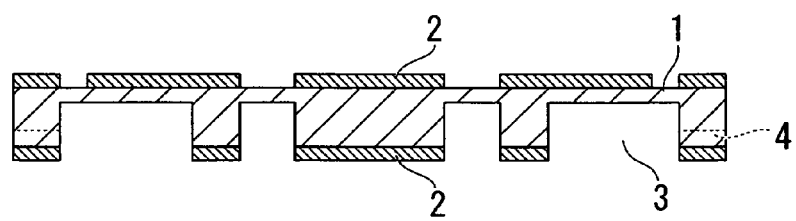
FIG. 1C is a cross-sectional view showing an example of a method of manufacturing a lead frame substrate according to the embodiment of the present invention in the process following that of FIG. 1B.

The metal plate 1 is etched from the lower surface thereof using an etching solution, such as a ferric chloride solution, which dissolves the metal plate, and thus holes 3 are formed (FIG. 1C). The holes 3 may have a depth after the holes 3 are etched with a thickness of about 10 to about 50 left such that a fine interconnection can be formed when the metal plate is subjected to second etching from the upper surface thereof, in order to allow the remainder of the metal plate to be finally formed into the interconnection.

Figure 2A:
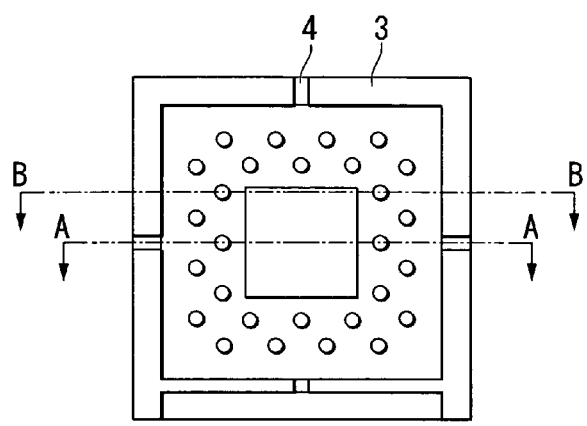
FIG. 2A is a top view showing an example of a lead frame substrate according to the embodiment of the present invention, wherein the lead frame substrate is subjected to first etching.
Figure 2B:
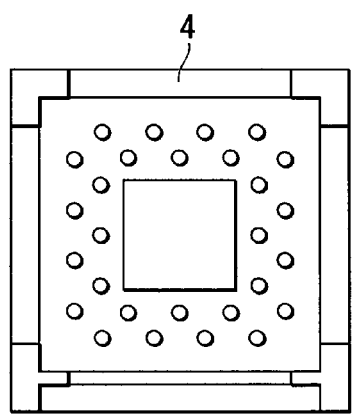
FIG. 2B is a top view showing another example of a lead frame substrate according to the embodiment of the present invention, wherein the lead frame substrate is subjected to first etching.
Figure 2C:
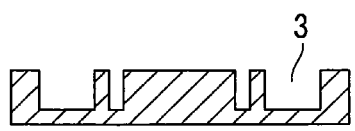
FIG. 2C is a cross-sectional view taken along line B-B of FIG. 2A.
Figure 2D:
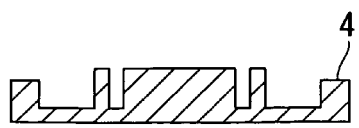
FIG. 2D is a cross-sectional view taken along line A-A of FIG. 2A.

Further, grooves 4 are simultaneously formed in at least a part of the outer frame section 12. As shown in FIGS. 2A and 2B, a region where each groove 4 is formed is not substantially limited as long as it does not influence the mechanical strength. However, in the typical outer frame section, a positioning hole called a guide hole is formed, and its surroundings may be formed with no groove. A depth of the groove 4 may be set to be less than a half of the depth of the hole 3. FIG. 2C is a cross-sectional view taken along line B-B of FIG. 2A. FIG. 2D is a cross-sectional view taken along line A-A of FIG. 2A. If the depth of the groove 4 is increased, the mechanical strength of the outer frame section is no longer maintained. The depth of the groove 4 can be adjusted according to dimensions of the aforementioned fine photoresist pattern, and a pitch.

Figure 1D:
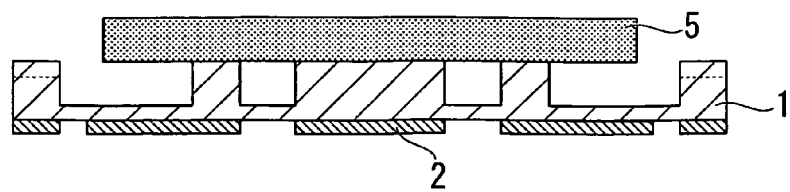
FIG. 1D is a cross-sectional view showing an example of a method of manufacturing a lead frame substrate according to the embodiment of the present invention in the process following that of FIG. 1C.

The etched metal plate 1 is turned upside down, and then a film type pre-mold resin 5 is coated on the upper surface of the metal plate 1 (FIG. 1D). Taking easy handling into consideration, the film type pre-mold resin is favorable. However, a liquid pre-mold resin of a solvent-free type or a solvent dilution type may be coated on the metal plate.

Figure 1E:
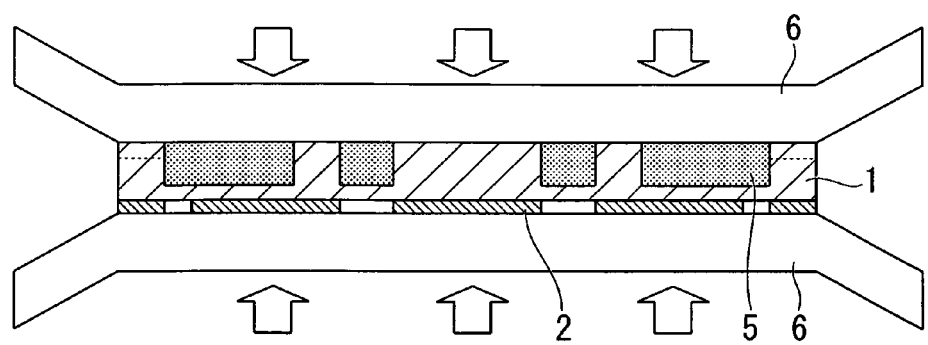
FIG. 1E is a cross-sectional view showing an example of a method of manufacturing a lead frame substrate according to the embodiment of the present invention in the process following that of FIG. 1D.

Next, opposite side surfaces of the metal plate are heated and pressurized by a flat-bed press, so that the pre-mold resin is melt-flowed and temporarily cured (FIG. 1E). When the pre-mold resin is melt-flowed, an extra amount of resin flows from the grooves 4 out of the metal plate. As such, the non-etched metal surface (the external connection terminals 11 and the outer frame section 12 excluding the grooves) can be flush with the pre-mold resin surface. Thereby, the pre-mold resin hardly remains on the non-etched metal surface. In the case of the metal plate where the grooves 4 are not formed, the melted pre-mold resin flows onto the outer frame section 12. As such, the resin remains on the outer frame section 12, and its thickness is equivalent to that of the resin that also remains on the outer terminals. The thickness of the resin ranges from about 20 μm to about 50 μm, and thus it is necessary to employ a removal process.

Figure 1F:
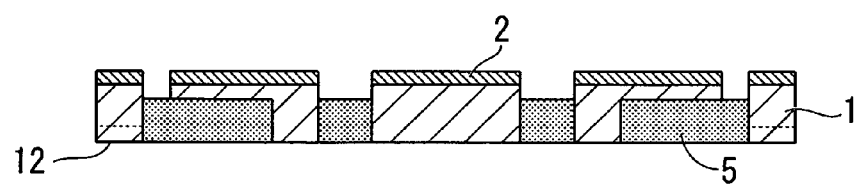
FIG. 1F is a cross-sectional view showing an example of a method of manufacturing a lead frame substrate according to the embodiment of the present invention in the process following that of FIG. 1E.
Figure 1G:
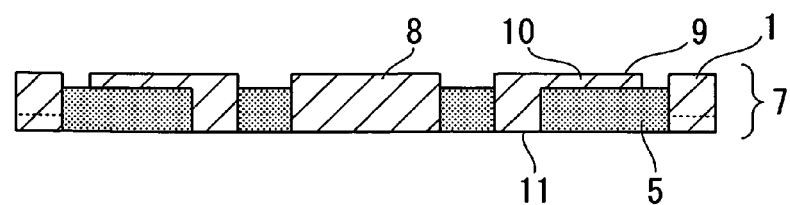
FIG. 1G is a cross-sectional view showing an example of a method of manufacturing a lead frame substrate according to the embodiment of the present invention in the process following that of FIG. 1F.
Figure 3A:
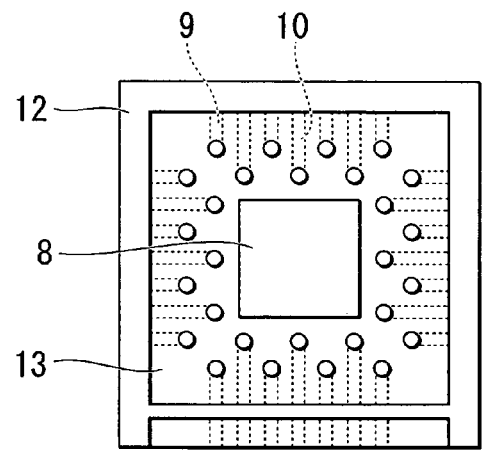
FIG. 3A is a top view of a semiconductor element mounting section side in a lead frame substrate according to the embodiment of the present invention.
Figure 3B:
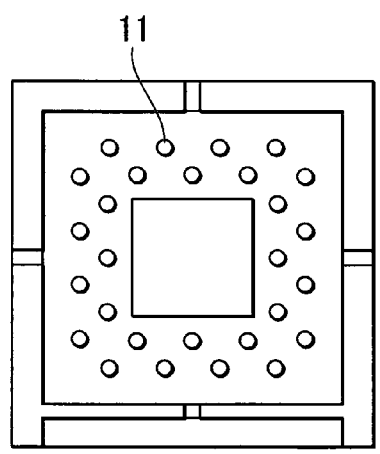
FIG. 3B is a top view of an external connection terminal side in a lead frame substrate according to the embodiment of the present invention.

Furthermore, the opposite surface is etched to form the semiconductor element mounting section 8, the semiconductor element electrode connection terminals 9, and the interconnections 10. Thereby, a lead frame substrate 7 is manufactured (FIG. 1G). FIG. 3A is a top view of the side of the semiconductor element mounting section 8, and FIG. 3B is a top view of the side of the external connection terminals. It is possible to dispose the external connection terminals in an array form, and to cope with a tendency to increase the number of pins of the semiconductor element.

Figure 4A:
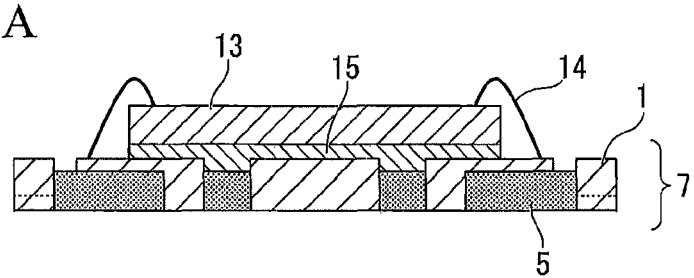
FIG. 4A is a cross-sectional view showing an example of a lead frame substrate according to the embodiment of the present invention, wherein a semiconductor element is mounted and then wire-bonded.

FIG. 4A shows a cross-sectional view of a lead frame substrate where a semiconductor element 13 is mounted and wire-bonded. The semiconductor element 13 is adhered by a die attach material 15, and is connected with semiconductor element electrode connection terminals 9 by gold wires 14. If necessary, the semiconductor element electrode connection terminals may be subjected to nickel-gold plating, tin plating, silver plating, or nickel-palladium-gold plating. When wire bonding is performed, the lead frame substrate is placed on a heat block, and is bonded while being heated. However, the pre-mold resin below the semiconductor element electrode connection terminals 9 is present on the same plane, and a hollow structure is not provided, so that it is possible to perform assembly without causing bonding failures.

Figure 4B:
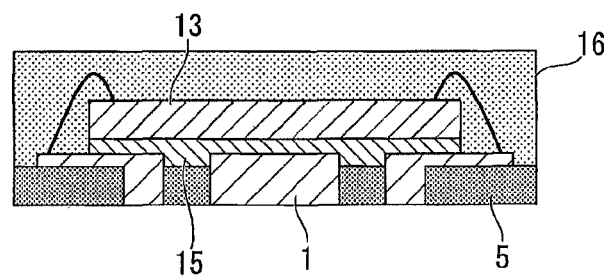
FIG. 4B is a cross-sectional view showing an example of a lead frame substrate according to the embodiment of the present invention, wherein a semiconductor element is encapsulated by transfer molding after the process of FIG. 4A.
Figure 5A:
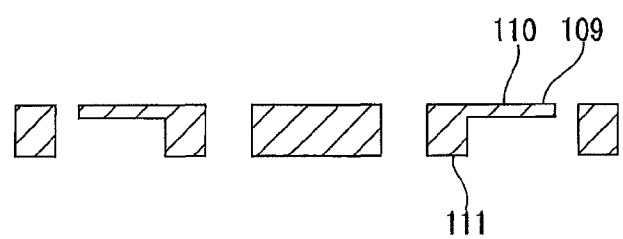
FIG. 5A is a cross-sectional view of a conventional lead frame substrate.
Figure 5B:
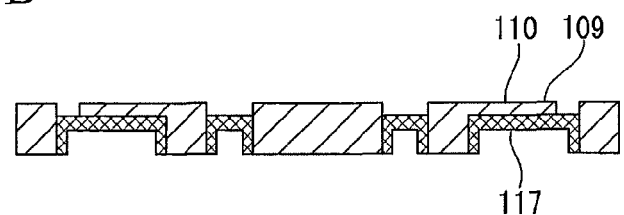
FIG. 5B is a cross-sectional view of a lead frame substrate disclosed in Patent Document 1.

Finally, the side of the semiconductor element is encapsulated by transfer-molding or potting, and then the outer frame section is separated by, for instance, a diamond blade, so that the lead frame substrate is formed into a small piece (FIG. 4B). In the case of the BGA type, solder balls are mounted on the external connection terminals, and thus the semiconductor package using the lead frame substrate is obtained.

EXAMPLE

Hereinafter, a method of manufacturing a lead frame substrate according to an embodiment of the present invention will be described with reference to FIGS. 1A through 1G taking a land grid array (LGA) type lead frame substrate as an example.

A manufactured LGA package has a size of 10 mm$^2$, and includes external connection terminals having an array form of 168 pins on a lower surface thereof.

First, as shown in FIG. 1A, a metal plate 1 (available from Furukawa Electric Co., Ltd., EFTEC64T), which was formed of a copper alloy and had a width of 150 mm and a thickness of 200 μM in a long strip shape, was prepared.

Next, as shown in FIG. 1B, photoresist (available from Tokyo Ohka Kogyo Co., Ltd., OFPR4000) was coated on both surfaces of the metal plate 1 by a roll coater so as to have a thickness of 5 μm, and then was pre-baked at a temperature of 90° C. Then, pattern exposure was performed from both surfaces via a photo mask having a desired pattern. Afterwards, development was performed using a 1% aqueous sodium carbonate solution, and then water-cleaning and post-baking were performed. Thereby, photoresist patterns 2 were obtained as shown FIG. 1B.

As photoresist patterns, a pattern which forms a semiconductor element mounting section 8, semiconductor element electrode connection terminals 9, interconnections 10, and an outer frame section 12 was formed on a first surface of the metal plate, and a pattern which forms external connection terminals 11, an outer frame section 12, and 5-mm wide grooves 4 formed in the outer frame section 12 at intervals of about 10 mm from the inside outward was formed on a second surface of the metal plate. As the pattern which forms the grooves 4, a dot pattern where dots having diameters of 30 μm were disposed in an array form at a pitch of 0.8 mm was used.

Next, the side of the first surface of the metal plate 1 was protected by covering a back sheet (not shown). Then, first etching was performed from the second surface of the metal plate using a ferric chloride solution, and parts of the metal plate exposed from the photoresist pattern of the side of the second surface were reduced in thickness up to 30 μm (FIG. 1C). Further, the depth of each groove 4 ranged from 80 μm to 100 μm. The ferric chloride solution was set to have a specific gravity of 1.38 and a temperature of 50° C.

The metal plate, the second surface of which was etched, was immersed in an aqueous ammonium persulfate solution of 50 g/L at 30° C. for 5 minutes, and thus the etched surface formed by the first etching was roughened (not shown). The metal plate was again immersed in a predetermined stripping solution based on an aqueous sodium hydroxide solution, and thus the photoresist of the second surface was stripped (not shown).

Next, a film-like thermosetting resin 5 (available from Ajinomoto Fine-Techno Co., Ltd., ABF GX-13) was coated on the second surface formed by the first etching (FIG. 1D), and was temporarily cured by heating under pressure at 120° C. for 5 minutes using a vacuum flat-bed press. The resin was again regularly cured at 180° C. for 3 hours, and thus a pre-mold layer was formed (FIG. 1E).

The thermosetting resin was excellent in fillability, and failures such as voids were not observed. Further, an unnecessary resin residue was extruded from the outer frame section 12 via the grooves 4 formed between press platens 6 and the outer frame section 12. For this reason, the thermosetting resin was hardly left on the non-etched surfaces of the external connection terminals 11 and the outer frame section 12. However, the non-etched surfaces were processed for about 3 minutes using an aqueous alkaline solution of potassium permanganate at 60° C. (potassium permanganate of 40 g/L+ sodium hydroxide of 20 g/L) in order to perform surface cleaning as well.

Next, the back sheet was removed from the side of the first surface, and then the parts of the metal plate, which were exposed from the photoresist pattern by performing second etching from the side of the first surface of the metal plate, were dissolved and removed by a ferric chloride solution. Thereby, the semiconductor element mounting section 8, the semiconductor element electrode connection terminals 9, the interconnections 10, and the outer frame section 12 were formed (FIG. 1F). The external connection terminals 11 extend from the semiconductor element electrode connection terminals 9. Although not shown, a back sheet may be adhered to the side of the second surface when the second etching is performed so as to prevent unnecessary etching from being performed on the side of the lower surface.

Subsequently, the photoresist pattern 2 of the first surface was stripped, and thus a desired lead frame type LGA substrate 7 was obtained (FIG. 1G).

Next, the metal surface exposed after the stripping of the photoresist was subjected to electrolytic nickel-gold plating. Thicknesses of the nickel and gold were 5 μm and 0.1 μm, respectively (not shown).

Then, a semiconductor element 13 was mounted on the lead frame type LGA substrate 7 according to the embodiment of the present invention using a die attach material 15, and then the die attach material was cured at 150° C. for 1 hour. Further, the electrodes of the semiconductor element and the semiconductor element electrode connection terminals 9 were connected by wire bonding using gold wires 14 having a diameter of 30 μm (FIG. 4A). A heating temperature for the wire bonding was 200° C. An entire strength of the wires on the side of the semiconductor element electrode connection terminals was measured to be 9 g or more, and good connection was obtained.

Afterwards, as shown in FIG. 4B, an area including the semiconductor element and the semiconductor element electrode connection terminals was encapsulated with a transfer-molding resin 16, and was cut into a small piece, so that a semiconductor package using the lead frame type LGA substrate was obtained.

INDUSTRIAL APPLICABILITY

A lead frame substrate of the present invention and a method of manufacturing the same are used to be able to reduce failures in manufacture or assembly of semiconductor packages and to obtain the lead frame substrate with high reliability against thermal stress, and particularly, are applied to multi-pin package substrates that cannot be supported for a lead frame type semiconductor package.

REFERENCE SYMBOLS

1: metal plate
2: photoresist pattern
3: hole
4: groove
5: pre-mold resin
6: flat-bed press platen
7: lead frame substrate
8: semiconductor element mounting section
9: semiconductor element electrode connection terminal
10: interconnection
11: external connection terminal
12: outer frame section
13: semiconductor element
14: gold wire
15: die attach material
16: transfer-molding resin
17: electrodeposited polyimide layer

The invention claimed is:
1. A method of manufacturing a lead frame substrate, the method comprising:
   forming a photoresist pattern to form each of a semiconductor element mounting section on which a semiconductor element is mounted, semiconductor element electrode connection terminals for connection with electrodes of the semiconductor element, and a first outer frame section on a first surface of a metal plate;
   forming a photoresist pattern to form each of external connection terminals, a second outer frame section, and grooves in at least a part of the second outer frame section on a second surface of the metal plate;
   etching a metal plate exposing section, in which the metal plate of the second surface is exposed, to form holes that do not pass through the metal plate exposing section and grooves that run from an inside to an outside of the second outer frame section;
   coating a pre-mold resin on the holes and the grooves, and heating the pre-mold resin under pressure using a flat-bed press to form a resin layer; and
   etching the first surface to form the semiconductor element mounting section, the semiconductor element electrode connection terminals electrically connected with the external connection terminals, and the first outer frame section.

2. The method according to claim 1, wherein, after the holes and the grooves are formed in the metal plate exposing section of the second surface, the etched second surface is roughened.

3. A lead frame substrate comprising:
a metal plate having first and second surfaces;
a semiconductor element mounting section formed on the first surface and configured to mount a semiconductor element;
semiconductor element electrode connection terminals, formed on the first surface, for connection with electrodes of the semiconductor element;
a first outer frame section formed on the first surface;
external connection terminals formed on the second surface and electrically connected with the semiconductor element electrode connection terminals;
a resin layer formed on the second surface;
a second outer frame section formed on the second surface and integrally formed with the first outer frame section;
grooves formed in at least a part of a side of the second surface and running from an inside to an outside of the second outer frame section; and
holes formed on the side of the second surface, filled with the resin layer, and configured not to pass through the metal plate.

4. The lead frame substrate according to claim 3, wherein the holes have roughened surfaces.

* * * * *